United States Patent [19]
Yamada et al.

[11] Patent Number: 5,245,281
[45] Date of Patent: Sep. 14, 1993

[54] NMR IMAGING METHOD

[75] Inventors: Noriaki Yamada; Susumu Kosugi; Toru Shimazaki; Makoto Miyazaki, all of Tokyo, Japan

[73] Assignee: Yokogawa Medical Systems, Limited, Tokyo, Japan

[21] Appl. No.: 274,999
[22] PCT Filed: Mar. 17, 1987
[86] PCT No.: PCT/JP87/00167
 § 371 Date: Sep. 15, 1988
 § 102(e) Date: Sep. 15, 1988
[87] PCT Pub. No.: WO87/05482
 PCT Pub. Date: Sep. 24, 1987

[30] Foreign Application Priority Data
 Mar. 18, 1986 [JP] Japan .................. 61-060385

[51] Int. Cl.$^5$ .................................. G01R 33/20
[52] U.S. Cl. .................................. 324/309
[58] Field of Search ............ 324/300, 307, 309, 310, 324/311, 312, 313, 314, 318, 322; 128/653.2, 653.5

[56] References Cited

U.S. PATENT DOCUMENTS 4,593,247 6/1986 Glover ............................ 324/307
4,748,411 5/1988 Holland ........................... 324/309

Primary Examiner—Michael J. Tokar
Attorney, Agent, or Firm—Moonray Kojima

[57] ABSTRACT

An NMR imaging method for imaging with isotropic pixel resolution and a short scan time by applying a non-square scan matrix matched to the sectional shape of a subject, wherein a non-square scan matrix is set with different vertical and horizontal dimensions corresponding to the sectional form of a subject and scan data is collected under two-dimensional Fourier transformation by setting the longer sides of the matrix in the direction of projection and the shorter sides in the warp direction, while simultaneously displaying an image in a non-square image matrix wherein a length corresponds to projection width A on one side and whose length corresponds to M/N time of projection width A (where M: number of view, N: number of sample in the direction of projection, and M<N) on the other.

20 Claims, 3 Drawing Sheets

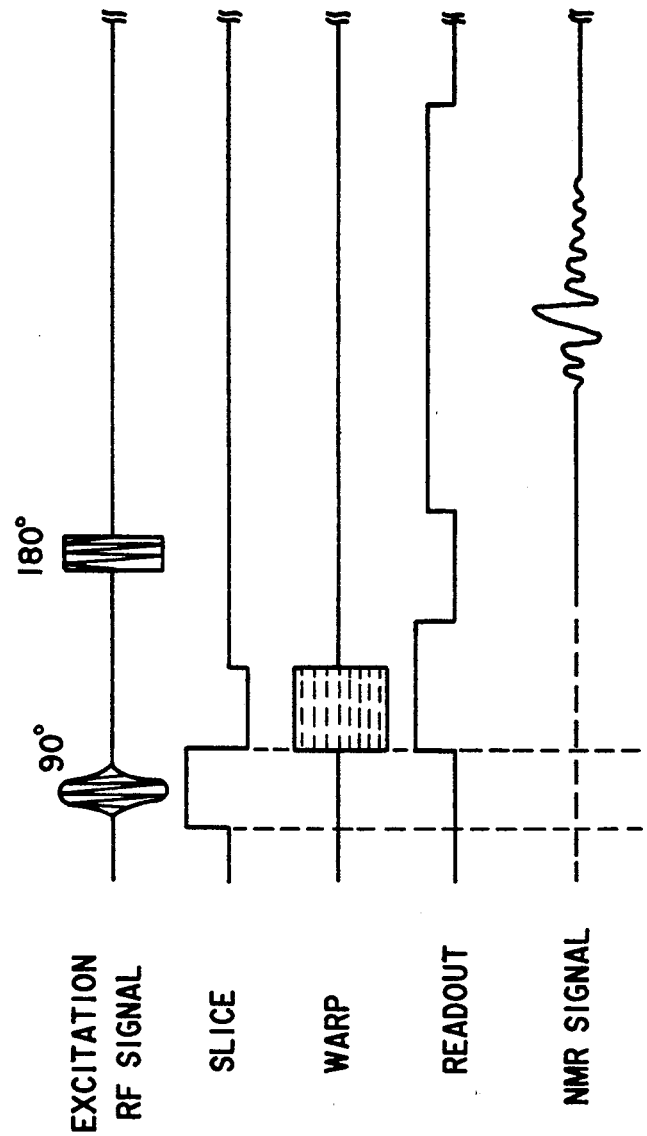

NMR IMAGING METHOD

FIELD OF INVENTION

This invention generally relates to an improved NMR imaging method used to develop a sectional image of a subject using scan data collected from the subject based on a nuclear magnetic resonance phenomenon. More specifically, this NMR imaging method enables imaging by using a non-square scan matrix with different vertical and horizontal dimensions, while maintaining isotropic pixel resolution.

BACKGROUND OF INVENTION

An NMR imaging device consists of a magnet section that includes a static magnetic field coil that provides a homogeneous static magnetic field, and a gradient magnetic field coil that provides a magnetic field having a linear gradient in each direction (x, y, and z) in a magnetic field with the same direction as the static magnetic field. Also included are transmission and reception sections that apply a high-frequency pulse (high frequency electromagnetic wave) to a subject placed in a magnetic field formed by the magnet section to detect NMR signals from the subject, and control and image processing sections that control the operation of the transmission, reception, and the above magnet sections to process the detected data and display images.

An NMR imaging device with the above mentioned configuration is driven in the pulse sequence of a two-dimensional Fourier method as shown in FIG. 4. This device collects data from the desired section of a subject. In other words, the imaging device applies slice gradient magnetic field $G_z$ and a 90° pulse (excitation RF signal) simultaneously to selectively excite the nuclear spin within a specific slice area of the subject. Then the device applies rephase gradient magnetic field $G_z$ to recover the spin phase deviation generated during slicing, while simultaneously applying dephase gradient magnetic field $G_z$ to provide spin with a phase difference to generate a spin echo signal. The device then applies warp gradient $G_y$. Then, all gradients are nullified and a 180° pulse is applied to invert the spin phase. Then, if read gradient $G_x$ is applied, a spin whose phase was dispersed due to the dephase gradient magnetic field has the phase matched again to enable an NMR signal to be observed as a so-called "spin echo signal." This NMR signal is equivalent to one line (one view) of the spin distribution of a subject after two-dimensional Fourier transformation.

Because line selection is determined by the product of the size of warp gradient magnetic field $G_y$ and the application time, the data required for image configuration can be collected by repeating the sequence shown in FIG. 4, while varying the size of the gradient magnetic field.

A scan matrix used for scanning a desired field of view (FOV) in a pulse sequence of the above mentioned two-dimensional Fourier method is generally a square matrix (matrix having four equal sides) of 64 Ch×64 views, 128 Ch×128 views, 256 Ch×256 views, or 512 Ch×512 views. Moreover, an image matrix used for reconfiguring images using such data is either a square matrix of 512×512, 256×256, etc., or their cutouts in a circular shape. For such a matrix, the vertical and horizontal resolution of an image becomes isotropic so that a natural image can be obtained. However, if the field of view is oval, the device may scan a wide area of air where no subject exists, and the data of sections not related to the image is collected, while taking a longer scan time than actually needed. Conversely, the scanning time in Fourier transformation is known to be roughly proportional to the number of samples (number of views) in the warp direction. Therefore, it is understood that to reduce the scanning time, the number of samples in the warp direction should be reduced, that is, scanning should be done using a non-square matrix. Actually, certain data is collected according to the scanning method of 512×256 or 256×128 (sample number×view number) for example. In such cases, when the scan time is reduced, no isotropy can be obtained for the vertical and horizontal pixel resolution of an image. Moreover, a large amount of data on air not related to the image is included.

DISCLOSURE OF INVENTION

The object of this invention is to provide an NMR imaging method that achieves isotropic pixel resolution and imaging within a short scan time by using a non-square scan matrix matched with the sectional form of a subject. According to the NMR imaging method of this invention, a non-square scan matrix with different vertical and horizontal dimensions corresponding to the sectional form of a subject is set. Scan data is collected under two-dimensional Fourier transformation by setting the longer sides of the matrix in the direction of projection and the shorter sides in the warp direction, while simultaneously displaying the image in a non-square image matrix whose length corresponds to projection width A on one side and a length corresponding to M/N time of projection width A (where M: number of view, N: number of sample in the direction of projection, and M<N) on the other.

BRIEF DESCRIPTION OF DRAWINGS

FIG. 4 shows an example of a pulse sequence under two-dimensional Fourier transformation.

PREFERRED APPLICATION MODE OF THE INVENTION

Figure 1:
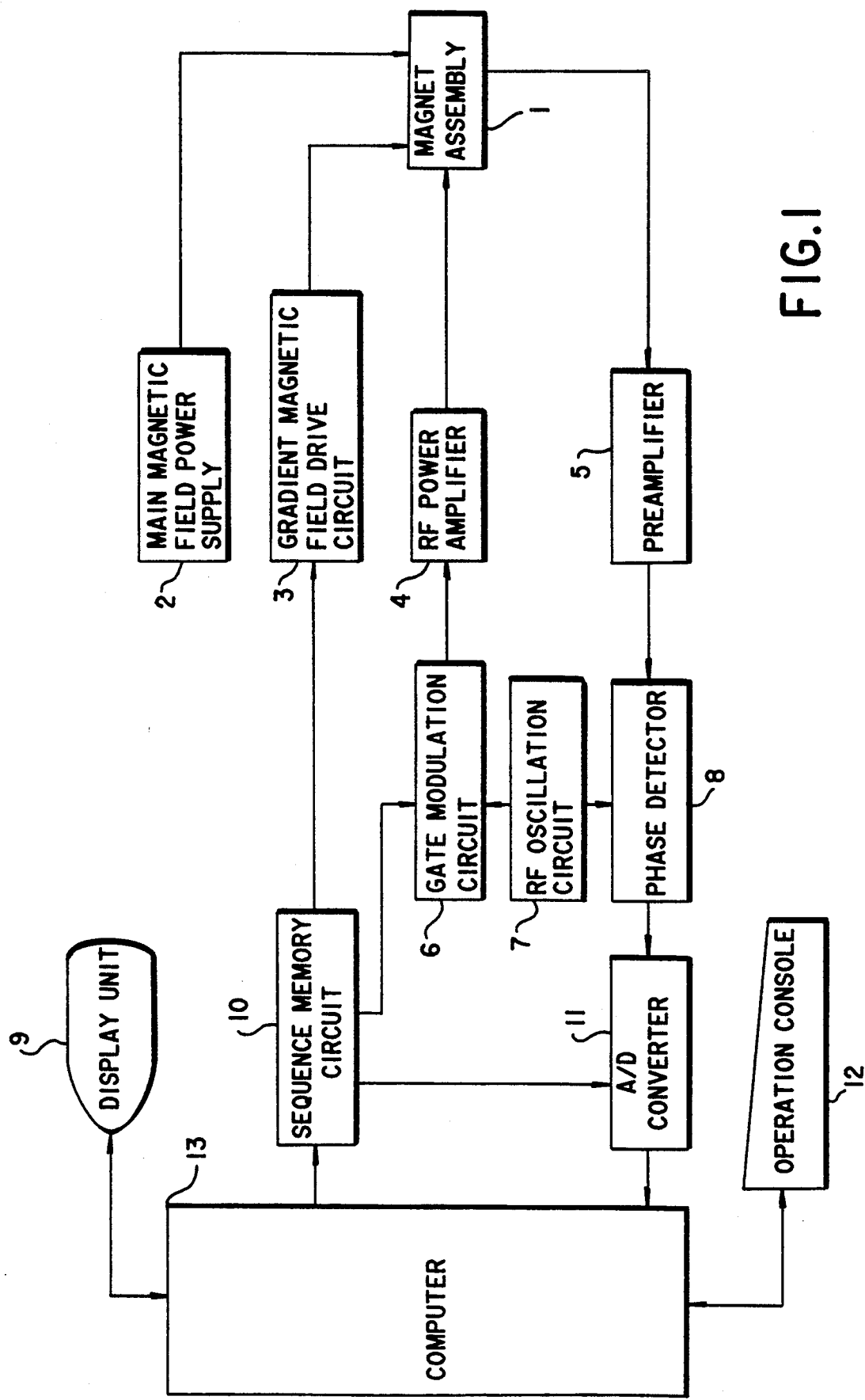
FIG. 1 shows the block diagram of the NMR imaging device used as the preferred application mode of according to the method provided by this invention.

An example of an application mode of this invention is described in detail by referring to the drawings as follows.

In FIG. 1, "1" indicates a magnet assembly having an inner space section for inserting a subject. The space section is surrounded by a static magnetic field coil that applies a constant static magnetic field to the subject, gradient magnetic field coils (x, y, and z) for generating a gradient magnetic field, an RF transmission coil for providing high-frequency pulses to excite the spinning of specified nucleuses inside the body system of the subject, and a receiving coil for detecting NMR signals sent from the subject (diagram omitted). The static magnetic field coil, gradient magnetic field coils, RF transmission coil, and receiving coil are respectively connected to main magnetic field power supply 2, gradient magnetic field drive circuit 3, RF power amplifier 4, and preamplifier 5. Sequence memory circuit 10 operates (according to a present sequence), gradient magnetic field drive circuit 3 and gate modulation circuit 6 according to instructions issued by computer 13 to generate a gradient magnetic field and high-frequency pulse signal in the preferred application mode according to the method provided by this invention. Sequence memory circuit 10 also operates gradient magnetic field drive circuit 3, gate modulation circuit 6, and A/D converter 11 in a Fourier-based sequence. Phase detector 8 uses the output from RF oscillation circuit 7 as a reference signal to detect the phase of an NMR signal detected by the receiving coil, then sends the data via preamplifier 5 to A/D converter 11. A/D converter 11 sends the NMR signals obtained through phase detector 8 after A/D conversion to computer 13.

Figure 2:
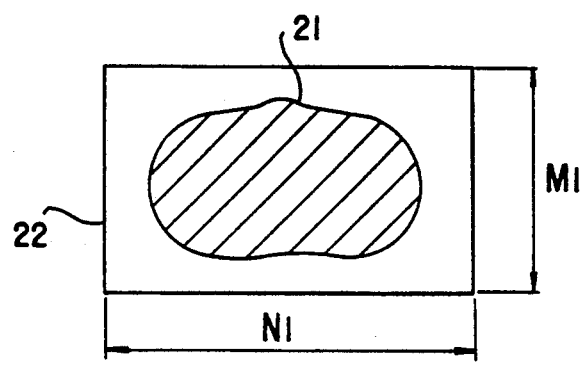
FIGS. 2 and 3 explain the operation of the application mode of this invention.
Figure 3:
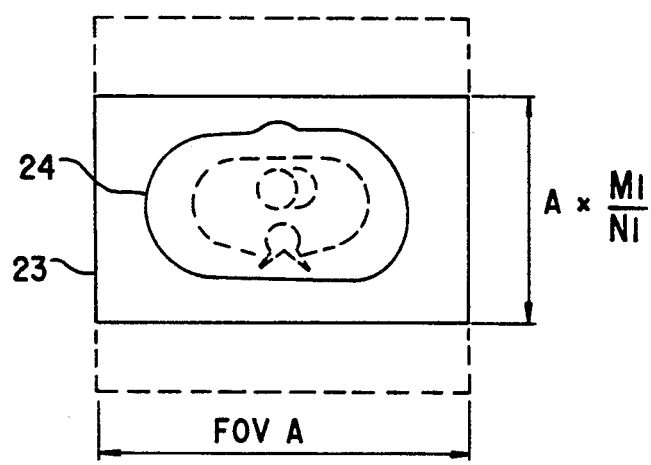

To exchange information with operation console 12 and enable various scan sequences, computer 13 switches operation of sequence memory circuit 10, reloads its memory and operates the image reconfiguration by using data sent from A/D converter 11, and outputs reconfiguration image data to display unit 9. Sequence information may be stored by computer 13, and be written as required to the memory of sequence memory circuit 10. The configuration described above is operated in the preferred application mode according to the method provided by this invention as follows:

In FIG. 2, if section 21 of a subject has a general oval shape and field of view 22 for imaging, it is matched with oval shaped section 21 of the subject, field of view 22 becomes a non-square shape with different vertical and horizontal lengths. Then, operation console 12 is used to set up a scan matrix of $M_1 \times N_1$ according to the vertical and horizontal lengths of field of view 22, where $M_1$ and $N_1$ are positive integers and $M_1 < N_1$. The longer side ($N_1$) of the selected matrix is matched to a longer side of the field of view, and is set in the direction of projection, while the shorter side ($M_1$) of the above matrix is matched to a shorter side of the field of view, and is set in the warp direction. By considering a dimension of the longer side of the field of view to be A, the pixel resolution in this direction is set at $A/N_1$. If a scan sequence is started after setting a scan matrix as described above, NMR signal measurement is done according to a pulse sequence based on the two-dimensional Fourier method shown in FIG. 4. Accordingly, NMR signals are collected from section 21 of the subject. The above-mentioned sequence is repeated the number of times determined by the scan matrix of $M_1 \times N_1$. Therefore, the number of samples on the projection axis and warp axis (number of views) will be $N_1$ and $M_1$, respectively. Because the number of views is now $M_1$, the scan time is reduced to $M_1/N_1$ for data collection using a square scan matrix of $N_1 \times N_1$. Collected scan data is converted into digital signal, then is sent to computer 13. Computer 13 operates the image reconfiguration according to a non-square image matrix whose length corresponds to projection width A of a scanned field of view on one side, and whose length corresponds to $A \cdot M_1/N_1$ on the other. Computer 13 outputs the result to display unit 9. Therefore, as shown in FIG. 3, image 24 (based on the result of the above operation) is displayed in screen size 23), which corresponds vertically to $A \cdot M_1/N_1$ and horizontally to A. Because the vertical pixel resolution at this time is $(A \cdot M_1/N_1)/M_1 = A/N_1$, the pixel resolution in both vertical and horizontal directions of the screen becomes $A/N_1$ so that a natural image with isotropy can be obtained. When such imaging is done, the relations between warp gradient $G_y$ and readout gradient $G_x$ are indicated by following expressions (1) and (2):

$$G_y = 1/(2\gamma \cdot FOV_y \cdot T_{sw}) \quad (1)$$

$$G_x = 1/(2\gamma \cdot FOV_x \cdot T_{samp}) \quad (2)$$

where
 $\gamma$: gyromagnetic ratio
 $T_{sw}$: warp time
 $T_{samp}$: readout time Accordingly, in the case shown in FIG. 3, the above-mentioned expressions are respectively replaced by expressions (3) and (4):

$$G_y = 1/(2\gamma \cdot A \cdot T_{sw} \cdot M_1/N_1) \quad (3)$$

$$G_x = 1/(2\gamma \cdot A \cdot T_{samp}) \quad (4)$$

The above application mode describes a sequence (generally called the SE method) of Fourier transformation. Needless to say, the application mode can be applied to sequences other than the above. Moreover, if the sectional shape of a subject is oval with a longer vertical direction dimension, a scan matrix with vertical and horizontal lengths of $M_2 \times N_2$ ($M_2$ and $N_2$ being positive integers and $M_2 > N_2$) can be set. For scanning, the longer side ($M_2$) of this matrix is matched with the longer side of the field of view, and is set in the direction of projection, while the shorter side ($N_2$) of the above matrix is matched with the shorter side of the field of view, and is set in the warp direction.

We have described the preferred application mode of this invention. This invention may be easily applied in other specific forms by persons possessing the technical knowledge in fields to which this invention is applicable without departing from the spirit or essential characteristics of the following claims.

We claim:

1. An NMR imaging method used to excite the nuclear spin of a desired section of a subject placed within a homogeneous static magnetic filed, and collect scan data based on nuclear magnetic resonance under a two dimensional Fourier method to display a reconfigured sectional image of the subject according to said scan data; wherein said method comprises the steps of setting a rectangular scan matrix with different vertical and horizontal dimensions;

reconfiguring an image by using scan data collected under a two dimensional Fourier method after setting the longer sides of said rectangular scan matrix in the direction of the projection axis and the shorter sides in the warp axis direction; and displaying a reconfigured image using a rectangular image matrix having a length corresponding to the projection width in the collected scan data on one side and a length corresponding to M/N times the projection width on the other side, wherein M indicates the number of views for scan data collection and N indicates the number of sample data on the projection axis.

2. In a method of magnetic resonance imaging in which each view of a plurality of views is phase encoded along one axis by a corresponding one of a plurality of phase encode gradient steps, the phase encode gradient step varying between upper and lower limits by multiples of a preselected increment, the improvement comprising increasing the gradient steps increment such that fewer views are required to span the field of view limits, whereby the image representation is stretched along the one axis;

in conjunction with creating a man readable image display, contracting a scale of the image representation along said one axis, whereby the image display is contracted along the one axis.

3. The method as set forth in claim 2 wherein the gradient steps increment is increased by a first percentage and the image scale is contracted by said first percentage, whereby in the contracting step the image representation is contracted back to its original scale for display.

4. The method as set forth in claim 3, further including:

measuring a dimension of a subject to be imaged along the one axis;

selecting the first percentage in accordance with a ratio of the measured dimension and a field of view along the one axis.

5. The method as set forth in claim 4, wherein the dimension measuring step includes:

scanning the object without a phase encode gradient to generate a projection of the object along the one axis; and, measuring a width of the projection.

6. The method as set forth in claim 2, further including:

generating a first projection of the object along a first axis;

measuring a width of the first projection;

generating a second projection of the object along a second axis orthogonal to the one axis;

measuring a width of the second projection;

comparing the first and second projection widths to determine the shorter;

aligning said one axis with the axis along which the projection width is shorter, whereby the phase encode axis is along the subject's shorter dimension.

7. The method as set forth in claim 6, further including:

determining a ratio of the first and second projection widths;

in the gradient step increment increasing step, increasing the gradient step increment by the ratio;

in the scale reducing step, reducing the scale in accordance by the ratio.

8. The method as set forth in claim 2, further including:

displaying the image display on a monitor such that the contracted scale image does not fill the field of view; and filling in unfilled portions of the displayed image with a preselected background.

9. A method of magnetic resonance imaging, the method comprising:

selecting a field of view of a generated image, which field of view extends in one direction along a frequency enconding axis and in another direction along a phase encode axis, the field of view corresponding to a preselected image region within a subject such that the imaged region is depicted within the image field of view, the imaged region including a region of interest therein such that the region of interest is depicted in the generated image;

determining a dimension of the region of interest along the phase encode axis;

adjusting an incremental step between phase encode gradient amplitudes of each of a plurality of views in accordance with a difference between the dimensions of the region of interest along the phase encode axis and limits of the field of view along the phase encode axis such that the region of interest is distorted along the phase encode axis to match the limits of the field of view along the phase encode axis;

collecting a plurality of views with the adjusted phase encode gradient amplitudes;

as the views are converted into the image, altering spatial dimensions of the image along the phase encode axis such that the depiction of the region of interest in the image is returned to an original scale.

10. The method as set forth in claim 9, further including filling areas within the field of view left empty by altering the spatial dimensions of the image along the phase encode axis with a preselected background.

11. The method as set forth in claim 9, wherein the step of determining the dimension of the region of interest along the phase encode axis includes determining a ratio between the limits of the field of view along the phase encode axis and the dimensions of the region of interest along the phase encode axis and wherein the step of adjusting the phase encode gradient steps includes enlarging the gradient steps by the ratio and wherein the step of altering the image spatial dimension includes contracting the image along the phase encode axis by the inverse of the ratio.

12. The method as set forth in claim 9, further including determining a dimension of the region of interest along the frequency encode axis;

determining a frequency spectrum corresponding to the frequency encode axis dimension;

filtering frequency components outside of the determined frequency spectrum of received resonance signals before transforming the resonance signals into the plurality of views.

13. A method of magnetic resonance imaging, the method comprising:

collecting a first magnetic resonance image view without a phase encode gradient such that a first projection of a subject in an imaging region along a first axis is obtained;

without a phase encode gradient, generating a second projection of the subject along a second axis;

determining widths of the first projection and the second projection;

determining the larger and smaller of the first and second projection widths;

determining a ratio of the larger projection width to the smaller projection width;

multiplying a phase encode gradient interval between adjacent views by the ratio and dividing the number of views to be taken per image by the ratio;

taking the reduced number of views each with a phase encode gradient that varies by the ratio adjusted interval to generate an image representation with the reduced number of views, whereby the image representation eliminates views which correspond to areas of a field of view that are beyond the subject.

14. The method as set forth in claim 13, further including:

determining a projection centering ratio of distance between a center of the field of view and extremes of the smaller projection width;

multiplying dimensions of the image representation along the phase encode axis by the projection centering ratio whereby the subject fills the field of view along the phase encode axis.

15. The method as set forth in claim 13, further including:
   position the larger width projection along a frequency encode axis;
   determining a spectrum of frequency corresponding to extremes of the larger projection width;
   filtering received resonance signals to eliminate resonance signals with frequencies outside of the determined frequency spectrum.

16. A method of magnetic resonance imaging, the method comprising:
   generating a projection of a subject to be imaged along a frequency encode axis;
   determining a spectrum of frequencies corresponding to points along the frequency encode axis between edges of the projection;
   while collecting magnetic resonance signals, filtering signals with frequencies outside the determined frequency spectrum, whereby signals with frequencies which do not correspond to the subject are filtered.

17. The method as set forth in claim 16, further including:
   determining a projection of the subject along a phase encode axis, which phase encode axis is perpendicular to the frequency encode axis;
   determining a ratio of the projections along the frequency and phase encode axes;
   adjusting a number of views per image and a phase encode angle between views in accordance with the ratio.

18. An apparatus for magnetic resonance imaging, the apparatus comprising
   a main magnetic field means for generating a generally uniform magnetic field longitudinally through an image region;
   a magnetic resonance excitation means for applying a magnetic resonance excitation pulse with a selected center frequency to excite magnetic resonance of dipoles in the image region;
   a phase encode means for applying phase encode gradients to phase encode the image region along a phase encode axis;
   a frequency encode gradient means for frequency encoding the image region along a frequency encode axis;
   an axis rotating means for selectively adjusting an orientation of the phase encode and frequency encode axes;
   a radio frequency receiver for receiving radio frequency resonance signals emanating from the image region;
   a filter means for filtering received resonance signals outside of a selected frequency range;
   an image reconstructing means for reconstructing a plurality of views from the filtered resonance signals into an image representation, each view being generated with a different phase encode gradient, which phase encode gradients vary by a multiple of a selected phase angle;
   an image memory for storing the reconstructed image representation;
   projection measuring means for measuring projections of a subject in the image region at least along first and second axes;
   a projection comparing means for comparing widths of the measured projections, the projection comparing means being operatively connected with the axis direction control means for selectively adjusting the phase and frequency encode axes such that the phase encode axis aligns with the axis with the smaller projection width.

19. The apparatus as set forth in claim 18, further including a frequency spectrum determining means for determining a spectrum of frequencies which lie along the frequency encode axis corresponding to extremes of the width of the projection measured along the frequency encode axis, the frequency spectrum determining means being operatively connected with the filter means for adjusting the selected frequency range.

20. The apparatus as set forth in claim 18, further including:
   a ratio determining means for determining a ratio of the projection widths of the subject along the phase encode axis to limits of a field of view of a display means for displaying a resultant man-readable image along the phase encode axis, the ratio determining means being operatively connected with the phase encode means for adjusting the selected phase angle by the ratio;
   an inverse zoom means operatively connected with the ratio means for reducing the magnitude of the resultant image along the phase encode axis in accordance with the ratio, the inverse zoom means being operatively connected between the image memory and the display means for converting the image representation into the resultant image.

* * * * *